United States Patent
Alpert et al.

(10) Patent No.: US 12,244,156 B2
(45) Date of Patent: Mar. 4, 2025

(54) SAFE ENCLOSURES FOR WIRELESS POWER SUPPLY

(71) Applicant: Wi-Charge Ltd., Rehovot (IL)

(72) Inventors: Ortal Alpert, Ness Ziona (IL); Yoav Biderman, Tel Aviv (IL); Ori Mor, Tel Aviv (IL); Omer Nahmias, Aminadav (IL); Lior Golan, Ramat Gan (IL); Ran Sagi, Tel Aviv (IL); Zohar Levin, Rehovot (IL); Alexander Slepoy, Chandler, AZ (US); Yan Rosh, Tel Aviv (IL); Eyal Conforti, Tel Aviv (IL)

(73) Assignee: Wi-Charge Ltd., Rehovot (IL)

( * ) Notice: Subject to any disclaimer, the term of this patent is extended or adjusted under 35 U.S.C. 154(b) by 797 days.

(21) Appl. No.: 17/423,802

(22) PCT Filed: Jan. 17, 2020

(86) PCT No.: PCT/IL2020/050076
§ 371 (c)(1),
(2) Date: Jul. 16, 2021

(87) PCT Pub. No.: WO2020/148772
PCT Pub. Date: Jul. 23, 2020

(65) Prior Publication Data
US 2022/0123601 A1  Apr. 21, 2022

Related U.S. Application Data

(60) Provisional application No. 62/793,400, filed on Jan. 17, 2019.

(51) Int. Cl.
*H02J 50/30* (2016.01)
*H02J 50/40* (2016.01)
(Continued)

(52) U.S. Cl.
CPC .............. *H02J 50/30* (2016.02); *H02J 50/40* (2016.02); *H02J 50/60* (2016.02); *H04B 10/11* (2013.01)

(58) Field of Classification Search
CPC ............ H02J 50/30; H02J 50/40; H02J 50/60; H04B 10/11
(Continued)

(56) References Cited

U.S. PATENT DOCUMENTS

2012/0146513 A1  6/2012  Radermacher
2017/0133816 A1  5/2017  Della-Pergola
(Continued)

FOREIGN PATENT DOCUMENTS

CN  205828875 U  12/2016
EP  1929678 B1  3/2018
(Continued)

OTHER PUBLICATIONS

English translation of Office Action in JP application 2021-541475, dated Dec. 5, 2023, 2 pages.
(Continued)

*Primary Examiner* — Suresh Memula
(74) *Attorney, Agent, or Firm* — Maine Cernota & Curran (57) ABSTRACT

A system for ensuring the integrity of the enclosure of a wireless power transmitter. The enclosure of the transmitter comprises a window in order to allow a high-power beam to exit the transmitter. The window is equipped with an area which reflects at least a portion of the beam, and directs the reflected beam onto a detector. Thus the system can ascertain whether the window is undamaged, since if the detector is receiving a satisfactory portion of the beam, then it is indicative of an undamaged window. This advantageously prevents dangerous beam generated damage which may be caused if the exit window of the transmitter is damaged. The laser beam is preferably circularly polarized before exiting the transmitter to prevent dangerous laser damage caused by the reflections of the maximum of the P or S polarization components, which may occur with linearly polarized beams.

20 Claims, 7 Drawing Sheets

(51) Int. Cl.
  *H02J 50/60* (2016.01)
  *H04B 10/11* (2013.01)
(58) Field of Classification Search
  USPC .......................................................... 320/108
  See application file for complete search history.

(56) References Cited

U.S. PATENT DOCUMENTS

| | | | | |
|---|---|---|---|---|
| 2018/0159338 | A1* | 6/2018 | Leabman | H02J 50/001 |
| 2019/0132056 | A1 | 5/2019 | Golan | |
| 2019/0341813 | A1* | 11/2019 | Slepoy | H01S 3/0071 |
| 2023/0208168 | A1* | 6/2023 | Sugihara | H02J 50/80 |
| | | | | 320/134 |

FOREIGN PATENT DOCUMENTS

| | | |
|---|---|---|
| JP | 5725941 B2 | 5/2015 |
| WO | 2007036937 A2 | 4/2007 |
| WO | 2011027278 A1 | 3/2011 |
| WO | 2017158605 A1 | 9/2017 |
| WO | 2019064305 A1 | 4/2019 |
| WO | WO-2020148772 A1 * 7/2020 ............ H02J 50/005 |

OTHER PUBLICATIONS

English translation of Office Action in CN application 202080021831.0, dated Feb. 4, 2024, 11 pages.
PCT International Search Report and Written Opinion of the Search Report, dated Apr. 20, 2020, 21 pages.
Extended European Search Report for EP Application No. 20741692.6, mail date Oct. 10, 2023.

* cited by examiner

SAFE ENCLOSURES FOR WIRELESS POWER SUPPLY

RELATED APPLICATIONS

This application is a national phase application filed under 35 USC § 371 of PCT Application No. PCT/IL2020/050076 with an International filing date of Jan. 17, 2020, which claims the benefit of U.S. Provisional Patent Application 62/793,400, filed Jan. 17, 2019. Each of these applications is herein incorporated by reference, in its entirety, for all purposes.

FIELD

The present invention relates to the field of wireless power beaming, especially as applied laser based transmission systems to beam optical power in a domestic environment to a mobile electronic device, using features which ensure that the transmitter enclosure prevents unsafe beam exposure even if the enclosure may be damaged.

BACKGROUND

There exists a long felt need for the transmission of power to a remote location safely without the need for a physical wire connection. This need has become important in the last few decades, with the popularization of portable electronic devices operated by batteries, and recently also with the proliferation of Internet of Things devices, which need recharging periodically or constant connection to electrical supply. Such mobile applications include mobile phones, laptops, cars, toys, wearable devices and hearing aids. Presently, the capacity of state of the art batteries and the typical battery use of a smart phone intensively used may be such that the battery may need charging more than once a day, such that the need for remote wireless battery recharging is important.

Almost a century after the invention of the battery, in the period between 1870 and 1910, Tesla attempted the transmission of power over distance using electromagnetic waves. Since then, many attempts have been made to transmit power safely to remote locations, which can be characterized as over a distance significantly larger than the transmitting or receiving device. This ranges from NASA, who conducted the SHARP (Stationary High Altitude Relay Platform) project in the 1980s to Marin Soljacic, who experimented with Tesla-like systems in 2007.

The typical battery of a portable electronic device has a capacity of between 1 and 100 Watt*hour, and typically requires a daily charge, hence a much higher power transfer at a much longer range is needed.

There is therefore an unmet need to transfer electrical power, over a range larger than a few meters, safely, to portable electronic devices.

Among the key obstacles for deployment of wireless power infrastructure in residential environment is safety, including safety of the equipment in unplanned situations and/or when the equipment is used by untrained people.

Currently allowed public exposure to transmitted laser power levels are insufficient for providing useful amount of power without a complex safety system. For example, in the US, the Code of Federal Regulations, title 21, volume 8, (21 CFR § 8), revised on April 2014, Chapter I, Subchapter J part 1040 deals with performance standards for light emitting products, including laser products. For wavelengths outside of the visible range, there exist, class I, class III-b and class IV lasers (class II, IIa, and IIIa are for lasers between 400 nm and 710 nm, e.g. visible lasers). Of the lasers outside the visible range, class 1 is considered safe for general public use and classes IIIb and IV are considered unsafe.

Figure 1:
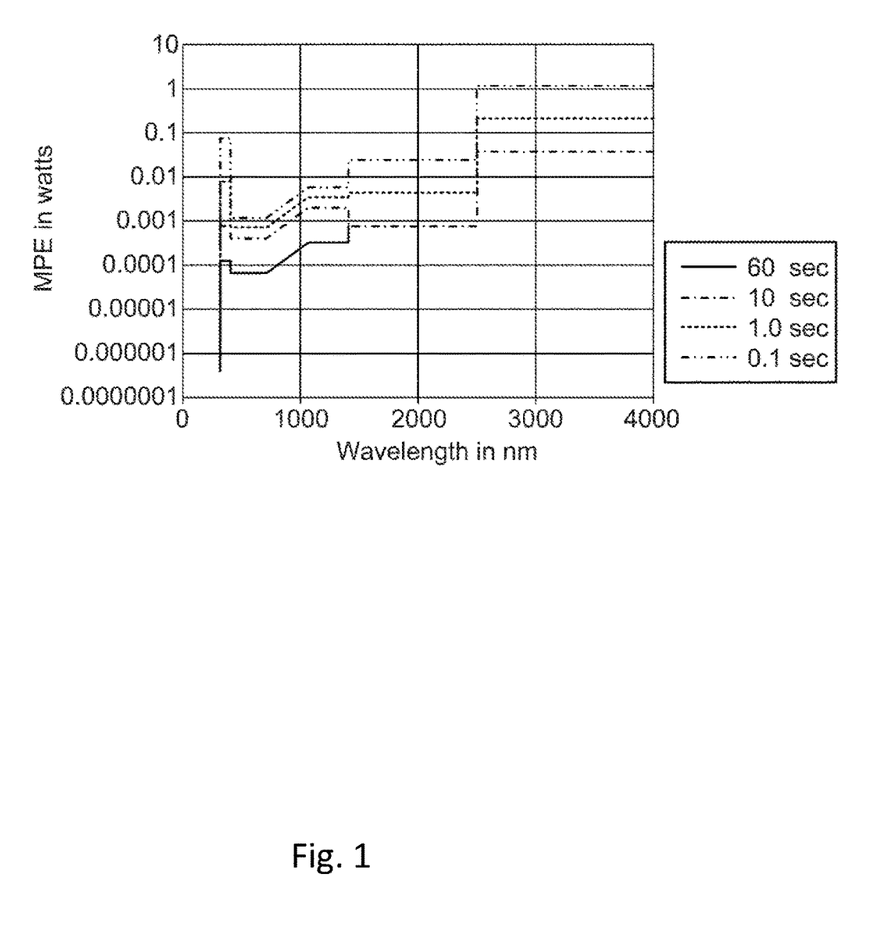
FIG. 1 shows the published maximum permissible exposure, converted to watts over a 7 mm pupil, for different exposure times, in accordance with US 21 CFR § 1040.

Reference is now made to FIG. 1 which is a graph showing the MPE (maximal permissible exposure value) for a 7 mm. pupil diameter, for class I lasers, according to the above referenced 21 CFR § 8, for 0.1-60 seconds exposure. It can be seen from the above graph that:
   (i) The maximum permissible exposure levels generally (but not always) increase with wavelength, and
   (ii) Even if the laser is turned off some 0.1 second after a person enters the beam, in order to meet the requirement specified in 21 CFR § 8, no more than 1.25 W of light can be transmitted, and that at wavelengths longer than 2.5μ, with the limit being orders of magnitude less at shorter wavelengths.

Thus, without some kind of safety system, only a few milliwatts of laser power are allowed to be transmitted, which even if completely converted back to electricity, would supply significantly less power than the power needed to charge most portable electronic devices. A cellular phone, for example, requires from 1 to 12 W for charging, depending on the model.

To transmit power higher than that of class 1 laser MPE, a safety system is needed. Such safety systems, such as the one suggested in WO 2007-036937 to Alpert et al, titled "System for Wireless Power Supply" disclose a system which protects the user from exposure when the user enters the beam.

However, the prior art does not deal with safety concerns arising from misuse, or from mishandling the system.

It is an objective of the present invention to provide a safety system that it resilient for misuse, mishandling, and other occurrences to the system that may render the systems described in the prior art useless.

The disclosures of each of the publications mentioned in this section and in other sections of the specification, are hereby incorporated by reference, each in its entirety.

SUMMARY

The present disclosure describes a system which remains safe even when the external enclosure of a wireless power transmitter adapted to supply power to a receiver located remotely from the transmitter undergoes damage.

The transmitter typically comprises a laser, for directing a laser beam towards receivers for wireless charging. The transmitter typically includes a beam deflection unit, allowing aiming of the laser beam at receivers located in the field of view of the transmitter.

The receiver typically includes a photovoltaic cell, for converting the received laser beam to electrical energy, which may be used to supply energy to an electronic device.

The laser inside the transmitter enclosure typically emits a high power beam and laser emission within the enclosure is typically not protected by a safety system in prior art systems.

Thus, if an object were to be inserted inside the transmitter, it may be exposed to dangerous levels of laser power. To prevent objects from being exposed to laser power inside the transmitter, and to protect the transmitter itself, the transmitter is typically equipped with a protective enclosure.

The transmitter is typically hung on a ceiling, or mounted on a wall, in a position similar to a lighting fixture. During wireless power supply, the receiver is typically situated in the same room as the transmitter, as the receiver should be in the field of view of the transmitter to receive wireless power. The transmitter uses the beam deflection unit to direct a beam towards a receiver, such that the transmitter is able to direct a beam towards the receiver even if the receiver changes positions.

The transmitter is typically installed in a house, office, commercial space or industrial space, with people who are typically untrained in operating the transmitter, and generally unprotected from laser damage, traversing the area around the transmitter. In such a setup, tall objects, for example, ladders, or flying objects, such as a ball, may bump into the transmitter and therefore damage it. Thus, if an object were to hit the transmitter, the enclosure of the transmitter may be damaged, which could cause potentially dangerous laser emission to become accessible or released.

The enclosure of the transmitter typically has a window, that may be made of a material such as glass or plastic, which is at least mostly transparent, either because of its overall level of transparency, or because separate parts of the window have different transparencies. This window allows transmission of the laser beam out of the protective encasing and towards the receiver. The window may transmit at least 85% of the beam. The window may comprise a protective layer such as Gorilla Glass®, as provided by Corning Inc., of Corning, NY, in order to make the window more durable, but even with such a durable window, and even if the window is partially or fully sunken inside the enclosure, the window may be prone to damage.

A broken or damaged enclosure window may present a safety hazard, such as dangerous levels of laser beam escaping the transmitter. This is because if the window were to be broken or damaged, the percentage of the beam absorbed or reflected by the window may be less than the anticipated level, thereby emitting a higher level of laser power than accounted for. Furthermore, the broken window may cause the beam to shift from its original intended position, causing it to impinge on a surface where it may do damage, rather than on the receiver, where it would be safely absorbed.

Thus, it is an objective of the current invention to provide a system which remains safe even when the external enclosure is damaged.

In one implementation, the window of the protective enclosure transmits most of the beam out of the transmitter and towards a receiver, thus providing wireless power to the receiver. However, a small portion of the beam is not directed at the receiver rather it is used to check the integrity of the transmitter's enclosure. This small portion of the beam is reflected off the window and is detected by a detector. Should the window of the transmitter be broken or absent, either none of the beam would reach the detector, or the properties of the beam reaching the detector, such as power, polarization, shape or other beam properties, may be degraded. Thus if the detector were to detect no beam, it may be an indication that the encasing window of the transmitter's enclosure is broken, as the absence of the partially reflective surface of the window would prevent reflection of the beam off the window and towards the detector. Alternatively, should a beam having unexpected beam qualities reach the detector, it may be an indication that the window is damaged, as a broken window may cause the reflected beam to have unanticipated beam qualities. Should the transmitter system detect damage to the encasing window, the system may respond by modifying the power level of the beam, typically by lowering the power of the beam, or terminate lasing completely.

The window may have a small area which is earmarked for reflecting a portion of the beam for verifying the integrity of the window, and that area may be coated in a reflective, or partially reflective coating. The laser may be instructed to direct the beam onto this small reflective area at predetermined intervals, such that the detector can periodically monitor whether the amount of beam it is receiving is satisfactory. The system may modify transmission parameters such as lowering the power level of the beam when performing such a window integrity check. Since a high powered beam is generally used to transmit power to a receiver during wireless power transmission, if such a beam would be directed at the special area, and partially or fully reflected towards the detector, the detector may be damaged by the high power of that beam. Furthermore, the area of the window used for broken window detection may be partially transparent, and thus a portion of the beam used for checking the integrity of the window may be transmitted through the window in an unsafe direction; thus it may be preferable to use a low powered laser beam.

The special area of the window may be opaque, reflective, absorbent, or may otherwise prevent a risk to the surrounding area. The system may cause the beam to pass over the special area at a fast scan speed and additionally or alternatively at a high power level. A beam attenuator, diffuser or reflector may be positioned between the laser and the special area. This component should be positioned such that it does not interfere with the beam traversing through the other parts of the window used for wireless power transmittal.

Alternatively, instead of using a special area for broken window detection, the entire encasing window may be partially reflective, such that any part, or at least a significant part, of the encasing window may be used to reflect a small portion of the beam for checking the integrity of the window, as will be explained hereinbelow.

In one exemplary configuration, the encasing window has a spherical shape, concave to the inside of the enclosure, with the pivot of the beam deflector and the broken window detector positioned at conjugate object and image positions, such that the beam reflected by the spherical window towards the inside of the transmitter, always arrives at the broken window detector, at an image point of the beam deflection unit. In such an embodiment, the entire area, or a significant part of it, may serve for broken window detection, which may be found on the optical path of the main beam. Alternatively, the encasing window may be flat, or nearly flat, and hence only a portion, typically less than 10% of the window's area, may be used for broken window detection.

In one exemplary embodiment, the transmitter is adapted to emit a beam having elliptical, or circular, polarization. The laser initially emits a linearly polarized beam, and a quarter wave plate may be used to transform the linear polarization emitted by the laser into a beam having elliptical, or preferably circular, polarization.

Having a transmitted elliptically polarized beam may be advantageous, since, unlike use of linearly polarized light, if the elliptically polarized light were to traverse a surface other than the receiver outside of the transmitter, a circularly polarized laser beam would be reflected at the average reflection of the P and S components, while a linearly polarized laser may be reflected by the maximum of the P or S components. Hence the maximum reflection by a transparent surface at angles different from the Brewster angle for circularly polarized light is lower, compared to that of linearly polarized light.

Thus, since beam reflections may present a hazard to the environment, and since it is not known at what angle the beam emitted by the transmitter will impinge on "foreign" transparent surfaces outside of the transmitter, it may be advantageous to use circularly polarized light.

Typically, the system also comprises a safety system which lowers the laser power or turns off the laser when an object is found between the transmitter and the receiver.

Such a safety system usually detects objects that are found between the transmitter and the receiver, but it is difficult to detect foreign objects inside the transmitter and prior art systems do not relate to this possibility.

It is further an objective of the current invention to provide a system and method for detecting damage to the enclosure, and specifically to the fragile window, which may encase the laser and other components of the transmitter.

It is further an objective of the current invention to provide a system and method for detecting damage to an optical component (the encasing window) even when such component may be contaminated, for example with dust and fingerprints.

It is further an objective of the current invention to provide a system which has improved signal-to-background performance in an unclean environment.

The current invention discloses a detection system configured to detect damage to the external transparent encasing window, and/or methods of using and operating the detection system.

The current invention comprises a laser, typically a diode laser adapted to generate an essentially collimated beam, in that the diameter of the beam remains rather constant throughout the operational distance of the system, and only spreads to a size bigger than the typical receiver size at ranges that are larger than the maximal operation distance of the system, such that the beam remains rather collimated for the operating range of the system.

If the window is broken or damaged, a safety hazard may be generated, such as increased output powers, or output from a different apparent position or direction than planned. Should the laser be emitting a beam at a certain angle, a broken window may cause the beam to shift from its intended angular position. Such a shift in the beam may be dangerous since a component of a safety system, such as the detector as described above, may be configured and aligned to a different position, and, should the safety system mistakenly protect a space other than the one intended, the system may become unsafe. The safety system is typically aligned with the beam, such as by bore-sighting its detection direction with the deflector mirror of the transmitter. As long as the window is not broken or moved, this co-directionality is maintained. But should the window be broken or otherwise changed, then the detection system and the beam may become unaligned, and the safety system may not operate as intended.

If the system, typically through the use of a detector, detects damage to the window of the transmitter, the system should be configured to respond, typically through the use of a controller, by changing the power level of the beam, typically either lowering the power level of the beam, or by terminating lasing completely.

Other portions of the external enclosure are preferably not made of fragile materials and are therefore less prone to damage, but, if the product design includes other fragile enclosure portions, the system may also include detectors for monitoring their state and responding to it if needed.

The current system may be designed to remain safe even if such less fragile portions of the enclosure are damaged. To achieve this, the current system may further include any of the following three components:

A double enclosure, such as an internal enclosure within the protective transmitter enclosure, designed to prevent access to dangerous internal components even when the external enclosure is damaged.

A reinforced enclosure built to withstand impact damage and wear and tear.

Actively protected portions of the enclosure—such as described above for the transmitter window.

The system of the present disclosure may emit a laser beam having elliptical, or essentially circular, polarization. The laser, typically a diode laser, is generally configured to emit a linearly polarized beam, and a quarter wave plate may be used to transform the linear polarization emitted by the laser into an elliptical, typically nearly circular, polarization. In an alternative embodiment, such modification of the beam is achieved using means other than a wave plate, such as by using Total Internal Reflection, as is known in the art.

Having the emitted beam elliptically polarized may be advantageous, since, unlike with linearly polarized laser, a transparent surface inserted into an elliptically polarized beam cannot traverse the surface at Brewster's angle, or an angle close to Brewster's angle, while a linearly polarized laser may traverse a transparent object at Brewster's angle, making the transparent surface very difficult to detect by safety systems.

Furthermore, should the laser beam impinge on a flat transparent surface at a large angle, a circularly polarized laser would be reflected at the average reflection of the P and S components, while a linearly polarized laser may be reflected by the maximum of the P or S components. Hence the maximum reflection by a transparent surface at angles above Brewster's angle for circularly polarized light is lower, compared to that for polarized light.

For example, if linearly polarized light were to impinge on a transparent surface having a refractive index of 1.5, at an angle of incidence of 60 degrees, 17.66% of the power may be reflected, compared with only 8.9%. of the power of a circularly polarized light.

Since such reflections may be a hazard to the environment, and since it is not known at what angle the beam emitted by the transmitter will impinge on "foreign" transparent surfaces, it may be advantageous to use circularly polarized light.

The current invention may use, depending on embodiment, more than one mechanism to detect damage to the external window. Some such methods are now listed.

In one embodiment, a light source is used to direct light towards the transmitter window, typically from inside the enclosure. The laser is generally used as that light source, but other sources, such as LEDs and laser diodes may also be used for this purpose. The front window typically has a slightly reflective coating, typically in the order of 0.05%-5%, allowing transmission of most of the light through the window, and a small reflection, typically under 1%, back towards the inside of the transmitter. Reflectance may be significantly higher, even above 90%, in an embodiment using an additional light source other than the laser. A detector is positioned to measure the reflection, and thus detect the presence of the window. Should the window be broken or absent, or tilted at an unexpected angle, the detector may either not detect the reflection, or would detect a change in it. The detector is usually connected to a controller that may be configured to cause the system to switch to a safe state upon detection of window damage or change to the window.

In one exemplary embodiment, the laser used as a power beam also acts as the light source.

Additionally, the detector may be placed in the return beam path of the laser, such that the detector is able to detect the central point of the field of view of the return beam. In such a setup, the most central point of the window is typically the most protected.

In one embodiment, the front window is coated with a conductive coating, and the window's electrical resistance or conductivity is measured by a sensor, allowing for detection of a broken window.

In yet another embodiment, the window is coated with a conductive coating, and the capacitance between the window and another plate, preferably also conductive and transparent, and roughly parallel to it, is measured. Should the window be broken, the capacitance would change and the system would react as if the window was broken.

In yet another embodiment, the power reaching the receiver is measured. When there is a sudden increase in power, typically after a short interrupt, it is possible that damage occurred to the window of the transmitter, and the system reacts as if the window was broken.

In another specific embodiment, ultrasound is used to detect the state of the encasing window, either by transmission of sound waves from one side of the encasing window to the other side of the encasing window, or by transmission of waves from the front of the enclosure window of the transmitter to the back of it, or by measuring the reflection of the sound waves off the window.

In yet another specific embodiment, a light source, typically an LED diode, is adapted to illuminate the side of the external window, and this light is totally internally reflected inside the glass towards a detector. Should the glass be broken, the Total Internal Reflection mechanism would terminate, and the signal detected at the detector would be affected, causing the system to react as if the window is broken or damaged.

Typically, the glass of the encasing is chosen so that its transmittance at the operating wavelength of the beam is greater than 90%, or even greater than 95%.

When the detector for detecting a broken window is situated close to the laser beam axis or coupled out of the laser beam axis, it should not block the beam. This is typically achieved using a beam splitter to couple out the reflected light.

If the detector is placed between the laser and a quarter waveplate, then a polarizer may be used to couple out the signal reflected by the front window, without a significant effect on the laser power transmitted out of the transmitter enclosure.

The ¼ lambda plate may be slightly tilted in order that its faces do not reflect light back into the detector, or more specifically the entrance pupil of the detector. Other components associated with the transmitter may also be slightly tilted to avoid such reflections. The tilt is intended, so that the detector for broken glass can detect the window, which at least at one point is not tilted, and does not receive a reflected signal from internal components. If positioned normal to the beam, it would reflect light back directly along the incident path, which may add to the light reflected by the front window and complicate broken window detection.

If the laser/power beam is used as the light source for detection of the front window, then an area on the front window is typically reserved for such detection. Such an area may have a special coating, used for broken window detection, or may use the same coating as the rest of the window. In such a case, the detector may be adapted to detect different power levels.

When transmitting power through the, typically small, area reserved for glass integrity detection, the transmission parameters such as the level of power transmitted to receivers, are typically reduced by the system, or, in some cases, power is not transmitted at all through the special area of the window.

Although power may not be transmitted at all, or transmitted at reduced performance, through a dedicated area, the laser beam may be periodically aimed at the area, or close to it, to verify glass integrity.

Such a special area on the window is characterized in that it reflects a portion of the laser light impinging on it towards the detector's pupil, while optionally allowing a significant portion of the light to traverse the window.

The detector may be positioned and configured so that, other than when it receives a reflection from the protected parts of the system, for example, from the window, it is shielded from the laser and does not receive the full power of the laser, or even significant portions of it.

The glass integrity detector typically has an entrance pupil. Light that passes through the entrance pupil reaches the detector. This light may be attenuated. Light that does not pass through the pupil is typically heavily attenuated. The size and position of the detector pupil may be chosen such that the area of the window used for broken window detection can be minimized, allowing for maximal power transmission to receivers. This allows for utilizing a maximum percentage of the surface of the window for wireless power transmission, through areas of the window other than the dedicated area.

In order to do so, the optical projection e.g. the possibly out of focus image, of the detector's pupil on the window should be similar to the beam diameter on the window.

A small physical aperture, e.g. a pinhole or an iris, or an alternative type of aperture, is typically placed at the detector's pupil. The pupil may be created by the aperture, or may be created by a lens or another focusing element in the beam's path. Such an aperture may serve to reduce light reflected from surfaces inside the transmitter, which make accurate detection difficult. The detector may advantageously be enclosed, or partially enclosed, in a structure adapted to block extraneous light arriving from directions other than the direction of the window.

In an alternative embodiment, the virtual image of the detector's pupil may be placed at a preferred location inside, or slightly outside, of the operational distance of the transmitter, such as at the center of the working range, or at the edge of the working range, or a preferred working distance of the operational range, of the transmitter. In such a case, the same detector may also be used to measure signals coming from a receiver during periods when the beam is not aimed at the special area on the transmitter.

For coupling the light from the optical output to the detector, a polarizing beam splitter, or a low loss beam splitter, may advantageously be used. The beam splitter typically should have less than 2% coupling towards the detector and more than 95% transmission, or reflection, of the power beam. One method for achieving such a configuration is to use a transparent slab, which may advantageously be flat, at an angle close to Brewster's angle, at a position where the beam is linearly polarized. This configuration allows for efficient transmission of the linearly polarized beam emitted by the laser, while the beam reflected off the window at the orthogonal polarization will be reflected efficiently towards the detector.

The system is typically also equipped with a detector configured to measure the power of the laser beam, referred to as a power monitor or detector. It is usually best to position the power monitor between the ¼ waveplate and the scanning mirror in order to avoid polarization dependence of the measured power.

A small portion, typically less than 10%, 5%, or 1% of the power of the laser beam, may be coupled towards a detector.

Placing the coupler of the power monitor between the waveplate and the scanning mirror allows the coupler to be polarization independent, which increases the accuracy of the power measurements, enables the detector to measure the power following any losses caused by other components, such as the broken glass detector and the waveplate, and enables the coupler to be small in size.

In one embodiment, the detector is positioned at the center of the coupled-out beam, outside the main beam's path. Alternatively, the detector need not be placed in the center of the beam. Furthermore, the beam diameter may be chosen to be a similar length to the detector's diameter.

In one exemplary embodiment, the coupled-out beam is focused onto the detector, allowing sampling of the entire beam's profile using a small, low cost, low noise detector. Such a configuration may be insusceptible to beam shape changes.

In a third specific configuration the coupled-out beam is diffused onto the detector, using a diffuser, allowing sampling of the entire beam's profile using a small, low cost, low noise detector. In such a case the detector itself may be placed outside the direction of the specular reflection/transmission of the diffuser, in order to measure a signal that is independent of beam shape changes.

Usually, such a configuration requires enclosing the diffuser and the detector in a small enclosure, in order to prevent other detectors in the system from being exposed to light from the diffuser.

In a specific embodiment, at least two power monitors are used.

In a preferred setup, the laser is a diode laser having a fast axis and a slow axis. The fast axis has a wider divergence angle at the exit of the laser diode, typically more than 30 degrees, and the slow axis has a smaller angle, typically less than 15.

The power monitor(s) is/are placed outside the direction of the specular reflection/transmission of the diffuser, and moved to the direction of the fast axis, rather than the slow axis (the direction as it is mirrored by the optical system) which may reduce noise.

In other alternative configuration, a fluorescent plate is used to extract a small amount of power from the main beam, without the need for a coupler, and that amount of power is directed onto the power monitor.

In another configuration, a polka dot beam splitter is used to couple out the power.

In another configuration, a power monitor is attached to the laser itself, optionally in the same casing, allowing low cost integration of the two components.

The power monitor's beam splitter may be placed between the scanning mirror and the quarter wave plate or another elliptical beam generator.

It is preferred, in some configurations, to use two beam splitters if using two power monitors.

Couplers used for monitoring parameters external to the transmitter, as well as for the broken window detector, may also be placed in the beam's path inside the transmitter. For example, for detecting a receiver or for detecting communication with a receiver, detecting a signal from a receiver, detecting objects between the transmitter and the receiver or other measurements of objects between the transmitter and the receiver or in the vicinity of the beam. Such couplers should couple light into a lens/mirror/focusing system pinhole/iris/aperture system, where the pinhole is positioned at an image spot of a place within the operating range of the system; in a more general notation, the pinhole is positioned at a distance between $$\frac{1}{\frac{1}{f} - \frac{1}{\text{minimal working range}}} + 250 \text{ micron} - f$$

and $$\frac{1}{\frac{1}{f} - \frac{1}{\text{minimal working range}}} - 250 \text{ micron} - f$$

from the focusing system focal point.

For example, if the focal distance of the lens is f, and the maximal operating distance is 10 m, then the pinhole should usually be positioned at a distance of $$\frac{1}{\frac{1}{f} - \frac{1}{10m}} - f.$$

There is thus provided in accordance with an exemplary implementation of the devices described in this disclosure, a wireless power transmission system comprising a transmitter and a receiver, the transmitter comprising:
(i) a laser adapted to emit a beam,
(ii) a power monitor configured to provide an indication of the optical power of the beam,
(iii) an external enclosure comprising an optical window configured to transmit the beam out of the external enclosure,
(iv) an internal enclosure within the external enclosure, comprising:
   the laser,
   the power monitor, and
   a beam blocking portion being at least one of (a) opaque, (b) partially transmitting having an optical density of at least 0.5, or (c) diffusive, the beam blocking portion being configured to absorb or diffuse at least part of the beam, or a reflection of the beam caused by an object inserted into the beam, if the beam or the reflection is directed on the beam blocking portion,
(v) a beam deflection unit, and
(vi) a control unit configured to control the laser,
wherein the system further comprises a detection unit configured to provide an indication of damage to the optical window of the external enclosure, the control unit configured to respond to the indication by causing a modification of a configuration of the system.

The beam blocking portion may be part or all of the walls of the internal enclosure, generally at least a major part of which have beam blocking properties, those properties being at least one of (a) opaque, (b) partially transmissive having an optical density of at least 0.5, or (c) diffusive, the beam blocking part of the walls being configured to essentially absorb or diffuse at least part of the beam, or a reflection of the beam caused by an object inserted into the beam, if the part of the beam or the reflection of the beam is directed on the beam blocking part of the walls, such that that part of the beam or the reflection is not directed out of the external enclosure through the optical window. The beam blocking properties of the internal enclosure are thus operative to prevent part of the beam or the reflection of the beam from an object inserted in the beam, from leaving the external enclosure other than through the window.

In such a wireless power transmission system, the modification of the system's configuration may be a modification in the laser beam.

Additionally, such systems may further comprise a collimator configured to cause the beam to diverge within the working range of the transmitter to no more than 5 degrees, the collimator being positioned inside the internal enclosure.

Furthermore, in any of such wireless power transmission systems, the external enclosure's window may have a transmittance of at least 90%. Similarly, the internal enclosure's window may have a transmittance of at least 90%.

In any such wireless power transmission systems, the beam deflector may be inside the internal enclosure.

According to yet further exemplary implementations of the present disclosure, there is provided a wireless power transmission system comprising a transmitter and a receiver, the transmitter comprising:
(i) a laser adapted to emit a beam having a power,
(ii) a collimator,
(iii) a polarization element configured to manipulate the beam's polarization state, and
(iv) a controller adapted to control the power of the laser beam,
wherein the receiver has a maximal angle of acceptance $\theta$ for the beam, and
wherein the polarization element is configured such that the polarization state of the beam exiting the transmitter is elliptical, the elliptically polarized beam comprising two phase shifted linear components having a power ratio greater than 1 between the larger component and the smaller component, and a phase shift between the two linear polarizations, and
wherein the laser power is controlled so that the power P of the beam emitted by the laser is less than $$\mu \left( \left| \frac{\cos\theta - \sqrt[1.73]{1-(0.578\sin\theta)^2}}{\cos\theta + \sqrt[1.73]{1-(0.578\sin\theta)^2}} \right|^2 + \left| \frac{\sqrt{1-(0.578\sin\theta)^2} - 1.73\cos\theta}{\sqrt{1-(0.578\sin\theta)^2} + 1.73\cos\theta} \right|^3 \right)$$

watts.

Yet further implementations of such wireless power transmitters may comprise:
(i) a laser adapted to emit an essentially collimated laser beam,
(ii) an external output window adapted to transmit the laser beam,
(iii) a beam deflection unit adapted to deflect the laser beam, in any one of a plurality of directions, through the external output window, and
(iv) a detector having a pupil,
wherein
the external output window has at least one area adapted to reflect a portion of the laser beam towards the pupil of the detector, and
the detector is protected from the laser when the laser is not aimed at the at least one area.

In such a wireless power transmitter, the system may further comprise a power monitor configured to detect at least a portion of the beam and to thus indicate the power of the beam. Additionally, such wireless power transmitter systems may further comprise at least two power monitors. In yet another implementation, the laser may comprise a first beam power mode having a power less than a second beam power mode. In the latter case, the transmitter may be configured such that at least one of the laser operation modes cannot be turned on when the beam is impinging on the at least one area. In this case, the beam deflection unit is adapted to direct the laser beam to the at least one area before the laser is switched between the two operation modes.

According to yet further exemplary implementations of the wireless power transmitters described above, the beam deflection unit may be adapted to direct the laser beam to the at least one area during system startup procedure. Furthermore, the power of the laser beam before scanning the at least one special area should be lower compared to the power of the laser beam after scanning the at least one special area.

In any of such wireless power transmitters, the at least one area may reflect less than 5% of the beam. Additionally, the transmitter may comprise at least one optical element adapted to change the polarization of the emitted beam. Furthermore, the laser may emit a linearly polarized beam, while the beam traversing the window may be an elliptically polarized beam or a circularly polarized beam.

In any of these cases, the optical element may be aligned at a small angle from normal to the beam. In that case, the alignment of the optical element should cause a reflection directed outside the pupil of the detector.

There is further disclosed a wireless optical power transmission system comprising:
(i) a laser adapted to emit a beam,
(ii) an enclosure for housing the laser, comprising:
 (a) a beam blocking portion, and
 (b) an enclosure window for transmitting the beam, the window comprising a pre-defined portion adapted to reflect at least a part of the beam onto a detection unit,
(iii) a scanning mirror adapted for directing the beam, and
(iv) a control unit adapted to receive signals from the detection unit and to determine at least one beam property,
wherein, when the beam is directed onto the pre-defined window portion, the control unit is adapted to use an output of the detection unit to evaluate the integrity of the window, and to control at least one of (i) the laser and (ii) a configuration of the system accordingly.

In such a wireless power system, the enclosure may further comprise an internal enclosure, adapted to house at least a portion of the laser. In that case, the window for transmitting the beam may be common to the external enclosure and the internal enclosure. Alternatively, the internal enclosure may comprise a second window for transmitting the beam towards the enclosure window. In any of those implementations, the internal enclosure may comprise the beam blocking portion.

According to yet a further implementation of such wireless power systems, the window may be spherical, concave to the inside of the transmitter, and a pivot of the scanning mirror and the detection unit are positioned at conjugate object and image positions, such that a beam reflected by the spherical window always arrives at the detection unit, for a range of angles of the scanning mirror.

Finally, any of these wireless power systems, may further comprise at least one power monitor, adapted to detect the power level of the emitted laser beam. In that case, the power monitor may comprise a diffuser and at least one detector, such that the detector receives a spatially dispersed beam.

BRIEF DESCRIPTION OF THE DRAWINGS

The present invention will be understood and appreciated more fully from the following detailed description, taken in conjunction with the drawings in which:

FIGS. 3A and 3B show exemplary implementations of a system for detecting the integrity of the window of the external enclosure shown in FIG. 2B; FIG. 3A shows an implementation using two separate windows for the internal and external enclosures, while

DETAILED DESCRIPTION

Reference is now made to FIG. 1 which shows the published maximum permissible exposure, converted to watts over a 7 mm pupil, for different exposure times, in accordance with US 21 CFR § 1040.

Figure 2A:
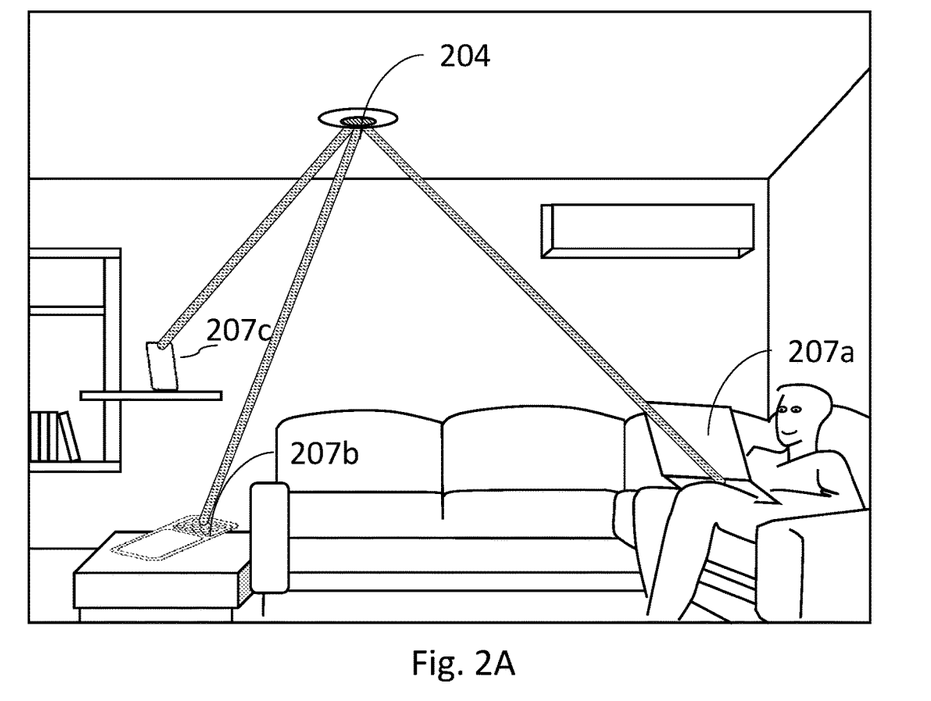
FIG. 2A, shows a typical residential environment in which a ceiling mounted wireless power transmitter may be used to charge the batteries of various portable electronic devices.

FIG. 2A, shows a typical residential setup where a ceiling mounted wireless power transmitter 204 may be used to charge various devices such as a laptop 207a, a tablet computer 207b and a phone 207c. It is to be understood that a transmitter may be able to only charge one device at a time, or may have the capability to charge more than one device simultaneously.

Figure 2B:
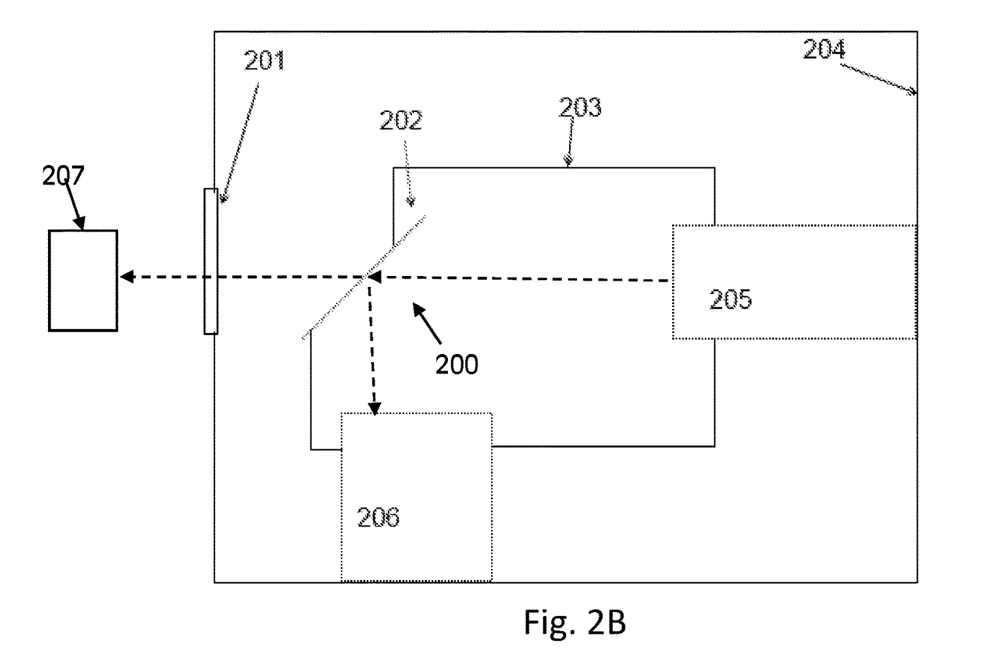
FIG. 2B illustrates one exemplary implementation of a transmitter, having an internal enclosure which houses a laser, and an external enclosure which may hold the other components of the transmitter.

Reference is now made to FIG. 2B, which illustrates one exemplary implementation of a transmitter, having an internal enclosure 203 which houses the laser 205, or at least the beam exit aperture of the laser, and an external enclosure 204 which may hold the other components of the transmitter.

The advantage of an external enclosure 204 is to protect the internal structure of the transmitter from damage, such as from knocks to the transmitter and additionally, to protect users from being exposed to potential damage such as electrical, mechanical, thermal or laser damage which could occur should the electrical and laser components not be properly enclosed and inaccessible.

External enclosure 204 is equipped with emission window 201, allowing the laser beam 200 to exit the transmitter towards the receiver 207, or to multiple receivers. With the exception of window 201, the enclosure 204 is typically made of opaque and durable material, such as metal, or durable plastic or rubber, so as to prevent passage of the laser beam through the walls of the enclosure. Window 201 is typically the only part of the external enclosure which allows laser beam through, and thus is typically made of glass or durable plastic.

Since fracture to the external enclosure 204 may occur, especially to the emission window 201, the external enclosure 204 should be equipped with means of turning the system off such as an off switch or a detachable power cable. The laser and other sensitive components should additionally be partially or fully encased within an internal enclosure 203, so as to provide protection to the user even if the external enclosure 204 is damaged, so that the laser is inaccessible at all times.

The internal enclosure 203 also protects the laser from damage, in case of damage to the external enclosure 204. In addition, the internal enclosure 203 acts as a dust protector to the internal components of transmitter 200. The internal enclosure 203 is also equipped with a window 202, so as to allow the beam 200 to leave the internal enclosure.

Internal enclosure 203 additionally may house:
(i) a power monitor 206, further shown in FIG. 10. The power monitor determines whether the level of beam which the laser is emitting is safe and acceptable. The internal enclosure 203 may not house the entire power monitor, however, the internal enclosure 203 houses at least the input aperture of the power monitor.
(ii) a beam splitter 202, for coupling out a portion of the beam towards the power monitor 206, which may also act as the internal enclosure's output window 202, as shown in FIG. 3.

Typically, at least the laser and the power monitor 206, which either measures the power of the laser beam, or energy per pulse, in the case of pulsed lasers, as well as other monitoring devices which may be employed by the system, are housed within the internal enclosure. The power monitor is housed within the internal enclosure because interference or damage to the power monitor may result in the system becoming unsafe, for example, if the system is configured to use the measured power level to determine the power of the beam emitted by the laser, then a faulty output measurement of the power monitor could cause the system to emit a beam having a dangerously high power level. Additionally, a safety system may be configured to use the power monitor to determine the portion of the beam being absorbed by the receiver.

This may be achieved by determining the difference between the power level of the emitted beam using the power monitor, and the level of power reaching the receiver. If the difference is below a predetermined level, this is indicative of a safe operation, since no substantial loss of power is occurring between transmitter and receiver. Thus it is important that the power monitor be protected and give accurate readings.

Other components may be outside the internal enclosure. For example, electronic parts of the laser, such as anodes and cathodes, may be positioned outside the protective internal enclosure, while the optical beam exit must be within it. Similarly, the optical aperture of the power monitor has to be totally enclosed within the protective internal enclosure. If an optical coupler is used to transmit/reflect a low percentage of the beam towards the power monitor while reflecting/transmitting another portion outside the internal protective enclosure, only a single side of the optical coupler need be inside the internal protective enclosure, i.e. the optical coupler may be set in the wall of the internal enclosure.

The non-transparent parts of the internal enclosure should be constructed to be capable of blocking the beam, should the beam be deflected from its designated path, for example as a result of a mechanical shock or as a result of a reflective component becoming dislodged from its intended secure position. These components should be designed to be capable of blocking the beam for a time long enough to allow for powering off the system, which may take up to 10 seconds, or more. Thus, the non-transparent parts are typically made of a material that does not transmit the beam, rather they should be constructed of a material designed to absorb the beam, or at least diffuse it. Furthermore, such materials should not melt when illuminated by the beam for a short period, typically at least 1-2 minutes, for instance to give enough time, for the user to respond and turn off the laser.

The transmitter is typically installed on the ceiling, making it difficult to access, and may be directly connected to mains power. Thus to allow the user to turn the system off, there may be an external off switch, which is typically found on the external enclosure or via a remote control or app. Alternatively the system may be connected to a power supply via a plug which allows for disconnecting.

Other components that may be located inside the internal protective enclosure include a collimation system, beam samplers and a beam deflection device.

Contamination of the power monitor by dust may cause the safety system to incorrectly evaluate the level of laser power emitted by the system, typically causing the system to under-estimate power, which may cause the system to perform unsafely.

Therefore, the internal protective enclosure should be, to some degree, dustproof, to prevent contamination of the laser and the power monitor by dust. However, small contaminations during the product lifetime are usually acceptable.

Figure 3A:
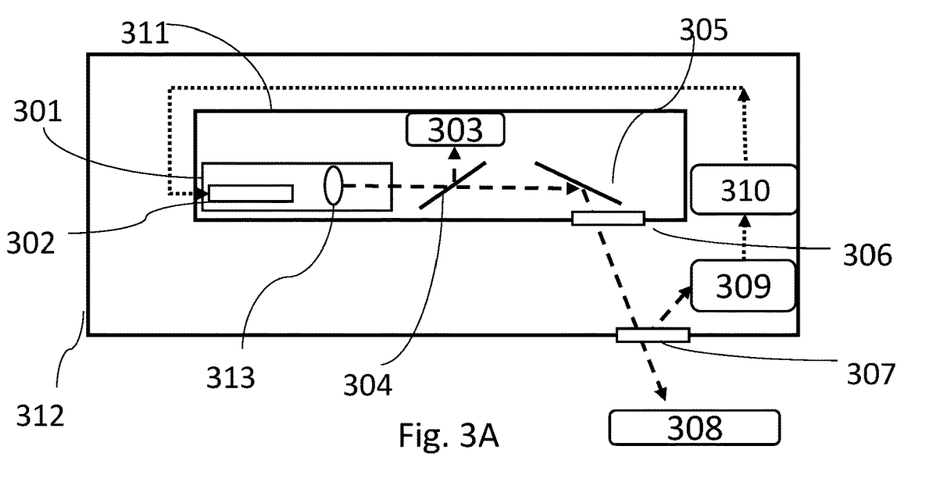
Figure 3B:
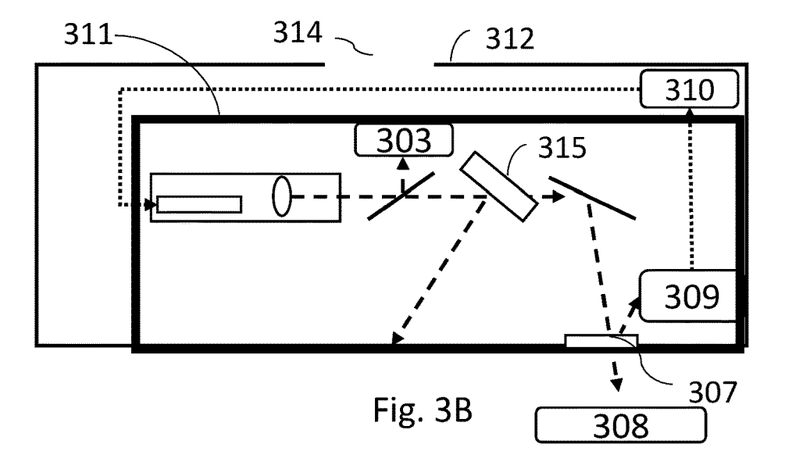
FIG. 3B shows an implementation using a common window for the internal and external enclosures.

Reference is now made to FIGS. 3A and 3B, which show exemplary implementations of a system for detecting the integrity of the external enclosure's window.

FIGS. 3A and 3B illustrates schematically a system in which a small amount of light reflected off the external enclosure's window is detected by a detector in order to evaluate whether the portion of the laser beam being reflected off the window is representative of an undamaged window. Should a lower level of the beam than expected be detected, which may indicate a damaged or missing window, the system may lower the level of the laser beam, or stop the laser from emitting a beam completely.

Reference is now made to FIG. 3A. Internal enclosure 311 comprises laser unit 301, generally having a diode laser emitter 302, and a collimation system 313 for producing a collimated laser beam. The laser beam is directed towards beam splitter 304, wherein beam splitter 304 typically directs less than 10% of the beam towards the power monitor 303, and allows the remainder through. Power monitor 303 determines whether the laser is emitting a beam at a safe and acceptable level.

The beam then impinges on scanning mirror 305, which deflects the beam towards the internal enclosure's window 306, and external enclosure's window 307. Windows 306 and 307 in FIG. 3A are shown as separate windows, however, the system may comprise one common window for the internal and external enclosure, as is illustrated in FIG. 3B.

The window of the external enclosure 307 may advantageously transmit the majority of the beam outside the transmitter, such that most of the laser's beam reaches the receivers, as shown by the beam impinging on receiver 308. On the other hand, a typically small portion of the beam is reflected off window 307 towards a detector 309, detector 309 being a window integrity detector for determining the state of the external window.

If the window were broken or absent, either none of the beam would reach detector 309, or the properties of the beam, such as power, polarization, shape or other beam properties, may be degraded.

The detector 309 may determine various properties of the beam it receives, and transmit to controller 310 the level or properties of the laser beam detected. Alternatively, detector 309 may send a signal to controller 310 should there be an indication that the window 307 is broken or absent. In the case that controller 310 does receive such a signal, or alternatively should controller 310 determine that the level of beam reaching detector 309 is not the level of the anticipated beam, controller 310 sends a signal to laser 301 instructing it to modify the power of the beam, or terminate completely, in order to prevent laser-generated damage as it is indicative that the external enclosure's window is broken or damaged.

Controller 310 may process the input and output signals for the whole system, for example it may control the power monitor, scanning mirror movements and laser power adjustment.

Figure 4:
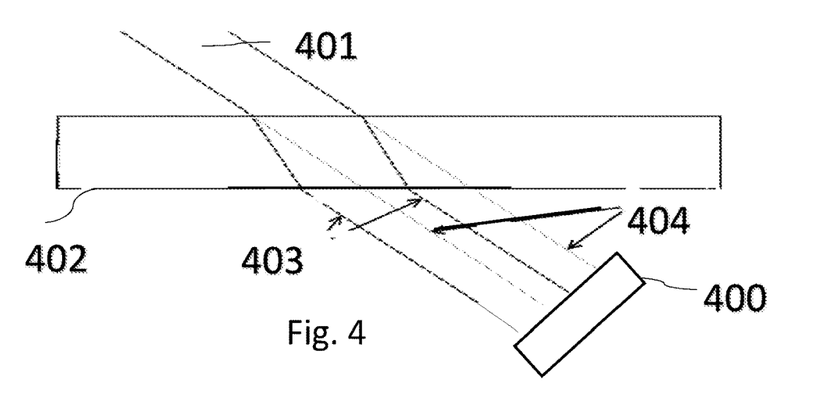
FIG. 4 illustrates an alternative exemplary system for detecting the integrity of the external window of the transmitter enclosure, by using a detector disposed outside of the transmitter to detect the beam transmitted through the window.

Reference is now made to FIG. 4, which illustrates an alternative exemplary system for detecting the integrity of the external window of the transmitter, by using a detector disposed outside of the transmitter to detect the nature of the beam transmitted through the window.

When the beam traverses the window 402, the beam is shifted from its original linear path, into a path parallel to the original beam 401, if both faces of the window are parallel.

The limits of the beam are marked as 403. Should the window be broken, and hence not in the beam's path, the beam would not be refracted by the window 402, and the beam limits would be defined by limits 404 instead of 403. Furthermore, no loss of power caused by the beam travelling through the window would occur. As a result, the beam marked by limits 404 would not only be in an unexpected position, it would also have higher power than anticipated.

A safety system for measuring the integrity of the window 402 may be implemented, using a detector, as shown by detector 400, which may detect the beam's properties, such as the position, direction, or power of beam 401, and the system may then use these properties as the basis of determining whether the window 402 is intact.

Figure 5:
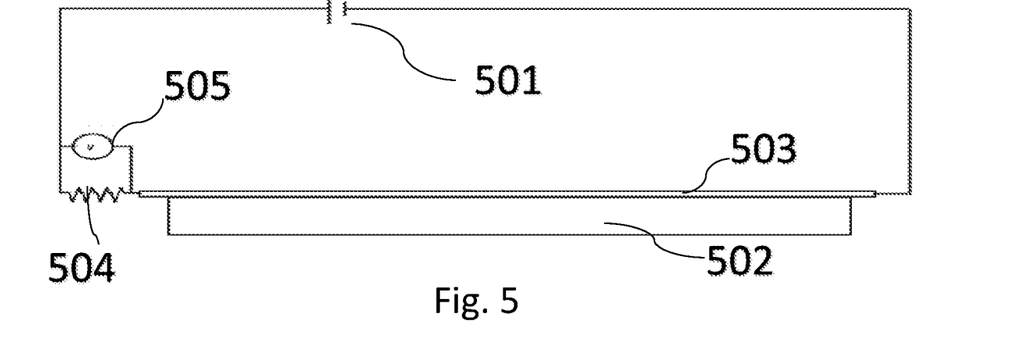
FIG. 5 illustrates an alternative system of determining the integrity of the external window, by coating it with conductive coating, whose resistance changes if the window is damaged.

Reference is now made to FIG. 5, which illustrates an alternative system of determining the integrity of the external window 502, by coating the external window with conductive coating and thus forming an electric circuit, and measuring, for instance, the current transmitted through the circuit.

Window 502 is coated with conductive coating 503, having a resistance 503 across the window. Resistor 504 is connected in series to the conductive coating, and the circuit is closed using power source 501 (typically supplying low voltage DC) and an electrical property, such as voltage, is measured by voltage meter 505, typically on resistor 504. Should window 502 be broken, conductive coating 503 would not conduct electricity, the circuit would be open, and the voltage on resistor 504 would change, typically drop.

Other circuits may also be designed to achieve the same results, including measuring the capacitance of the window between electrodes on its opposite surfaces.

Figure 6:
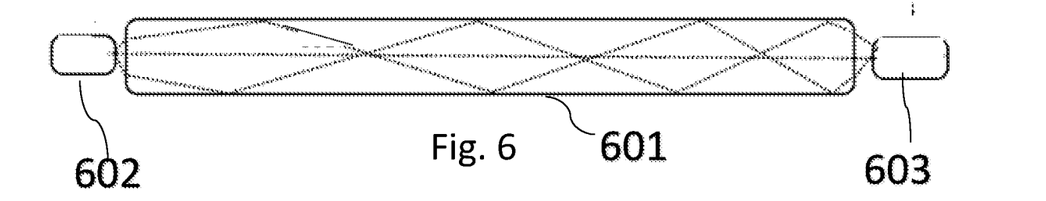
FIG. 6 illustrates an alternative system of determining the integrity of the external window of the transmitter enclosure, by using total internal reflection of light passing through the mirror.

Reference is now made to FIG. 6, which illustrates an alternative system of determining the integrity of the external window of the transmitter by using total internal reflection. Window 601 has a refractive index n causing it to reflect light impinging on its surface at an angle greater than $\sin^{-1}(1/n)$. LED 602 illuminates the window from one end and detector 603 is positioned so that it can detect the light that is Totally Internally Reflected through window 601. Should window 601 be broken the portion of light received at detector 603 would drop significantly.

Figure 7:
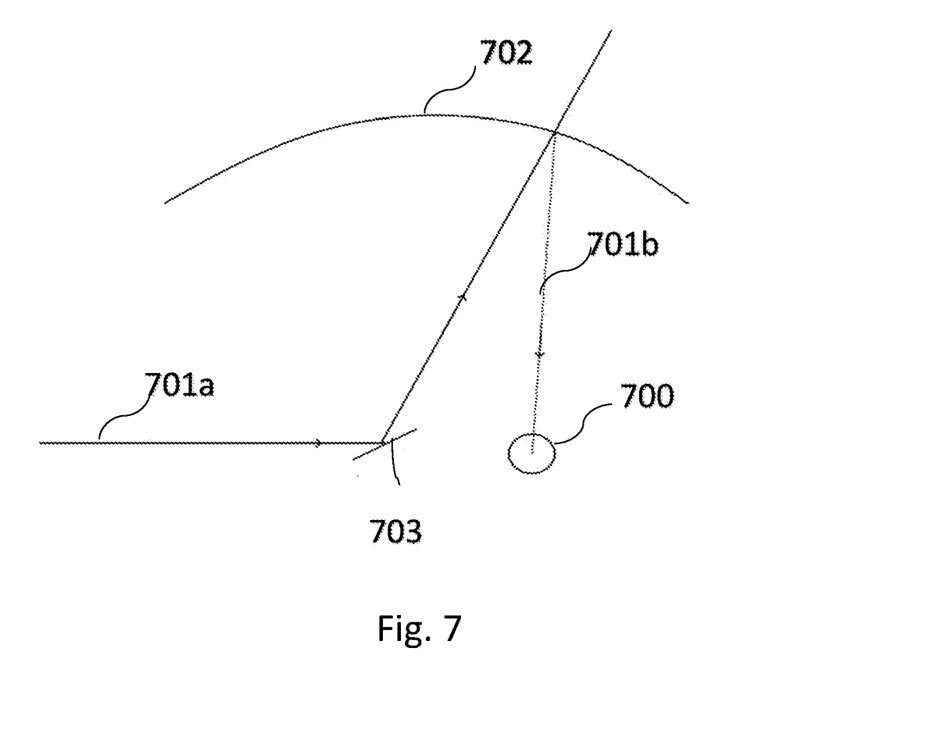
FIG. 7 illustrates an embodiment in which the window is partially reflective and has a spherical shape, to enable window integrity to be ascertained for any angle at which the beam is scanned.

Reference is now made to FIG. 7, which illustrates another embodiment in which the entire window of the transmitter is partially reflective, such that any part, or at least a significant part, of the encasing window may be used to reflect a small portion of the beam for checking the integrity of the window.

This embodiment differs from those shown previously, in that the transmitter window 702 has a spherical shape, concave to the inside of the enclosure, with the pivot axis of the beam deflector 703 and the window integrity detector 700 positioned at conjugate object and image positions, such that, despite the scanning motion of the scan mirror 703, the beam 701b reflected by the spherical window 702 back into the enclosure, always impinges on the window integrity detector 700, which is located at an image point of the beam deflection unit 703. In such an embodiment, the entire area, or a significant part of it, may serve for broken window detection.

Thus the beam 701a used for wireless charging may be used for ensuring the integrity of the window, and the laser beam need not be directed at any specific area of the window periodically for broken window detection.

It is to be understood that any of the window systems as described in FIGS. 5-7 could either be used for the external window of the transmitter, for allowing a beam to exit the transmitter towards receivers, or as a window of an internal enclosure, used to encase the laser and other sensitive components, or both. Either of these two windows could need monitoring for damage. In an arrangement where an internal enclosure shares a window with an external enclosure, the systems as described above could be used for that shared window.

Figure 8A:
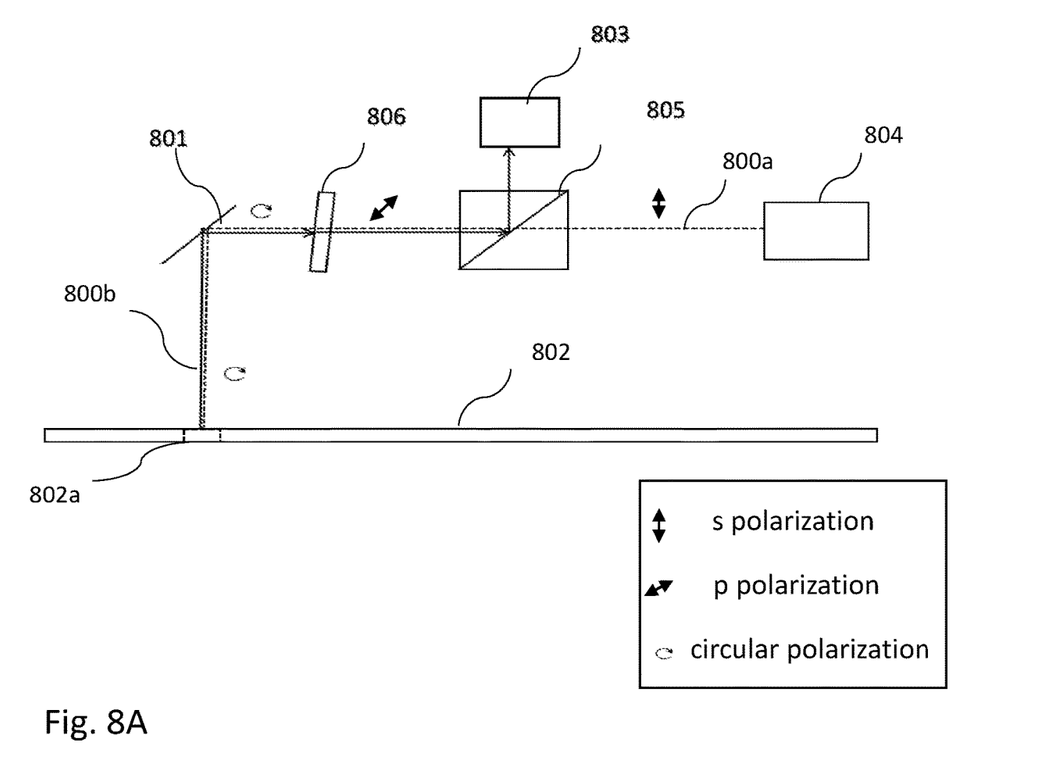
FIGS. 8A and 8B, illustrate two alternative exemplary systems in which a specific portion of the window having predetermined reflective properties is used to monitor the integrity of the window.
Figure 8B:
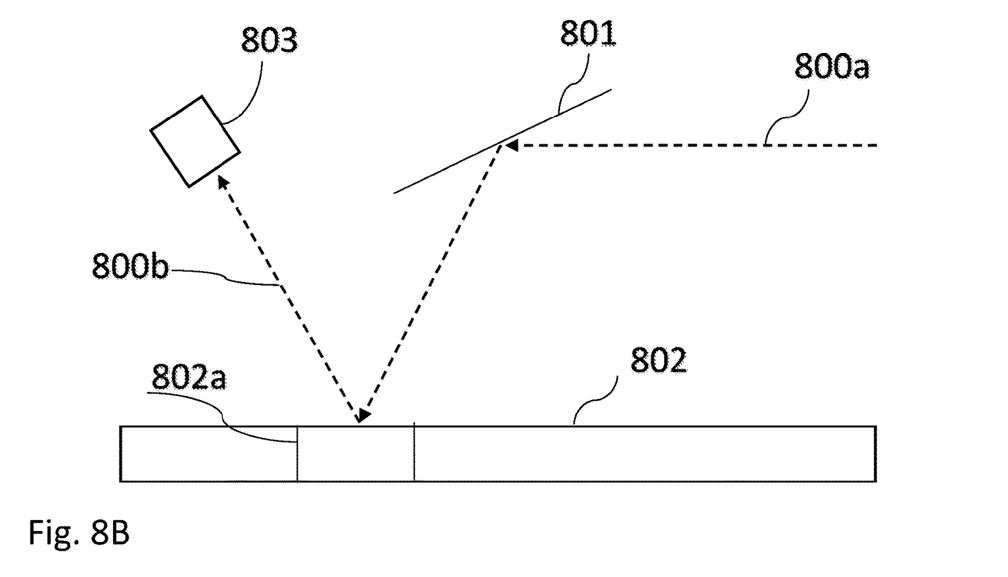

Reference is now made to FIGS. 8A and 8B, which illustrate an alternative exemplary system in which a specific portion of the window is used to monitor the integrity of the window.

Although the scanning mirror 801 generally rotates in order to direct the beam onto transmitters and receivers which may be situated around the room, at regular intervals, scanning mirror 801 is positioned so that it directs the beam 800a onto a specific portion of the window 802a, as shown in FIG. 8B, in order to test the integrity of the laser's encasing window 802.

The specific window area 802a may be coated with special reflective coating in order to more efficiently reflect the beam towards the detector.

The specific window area 802a is the area of the window onto which the beam 800a impinges at normal incidence to the window, thus directing a portion of the beam directly back to the scanning mirror 801. The specific window area 802a is representative of the state of laser's encasing window as a whole. Differences in the amount of beam power coming from the window area 802a from that normally expected from the undamaged window would indicate a problem with the window 802: if no portion of the beam is reflected back to the scanning mirror, the window may be broken, and if a smaller amount of the beam is reflected than anticipated, the window may be damaged or dirty. The specific window area 802a as shown in FIG. 8 is used as any reflection of the beam by the specific window area 802a reaches the scanning mirror 801.

Thus, the level of the beam reaching detector 803, provides an indication of the state of the window.

FIG. 8B illustrates an alternative way of positioning the detector 803, such that the beam is reflected directly towards detector 803, instead of travelling back through scanning mirror 801, as shown in FIG. 8A.

When the scanning mirror 801 is positioned at a specific angle, the beam 800a impinges on the window area 802a, which may be coated with a reflective coating in order to better reflect the beam. This allows the detector 803 to detect the laser beam being reflected off the window area when the window is present, and to determine how much of the beam is being reflected off window area 802a, thus providing an indication of the state of the transmitter's external window 802.

The scanning mirror may direct the beam onto window area 802a at regular intervals, to enable the detection of reflected light off the window, thereby ensuring the integrity of window 802.

FIG. 8A additionally illustrates an advantageous system of circularly polarizing the beam 800a before it leaves the laser's encasement. Once the beam has left the transmitter, through window 802, the beam may be reflected off objects within the room, which could potentially cause dangerous, uncontrollable beam-generated damage. When a linearly polarized beam is reflected off surfaces, different components of the beam may be more strongly reflected than for an unpolarized or otherwise polarized beam, and thereby increasing the level of beam which could be reflected around the room.

FIG. 8A advantageously illustrates a system in which the linearly polarized beam 800a emitted by laser 804 is circularly polarized, by quarter wave-plate 806 before leaving the laser's encasement window 802.

Quarter wave-plate 806 is shown as being tilted slightly, to advantageously prevent any part of the beam from being reflected directly back into the laser 804.

FIG. 8A illustrates a system in which the laser 804 emits a beam which is linearly polarized in a direction such that it advantageously travels straight through polarizing beam splitter 805 without any of the beam being reflected, thus reducing beam losses.

However, on the beam's return from the window 802, the beam first travels through quarter wave-plate 806, which linearly polarizes the beam in a perpendicular direction such that when it travels through polarizing beam splitter 805, most, or all, of the beam is reflected at right angles, thus reaching the detector 803, and not the laser. A returning beam could damage the laser, or cause a dangerous level of beam to be emitted from the laser.

Thus, the exemplary system, as shown in FIG. 8, advantageously uses linear polarization when travelling through polarizing beam splitter 805 and circularly polarized beam when the beam leaves the transmitter and travels around the room, with the concomitant advantages.

Figure 9A:
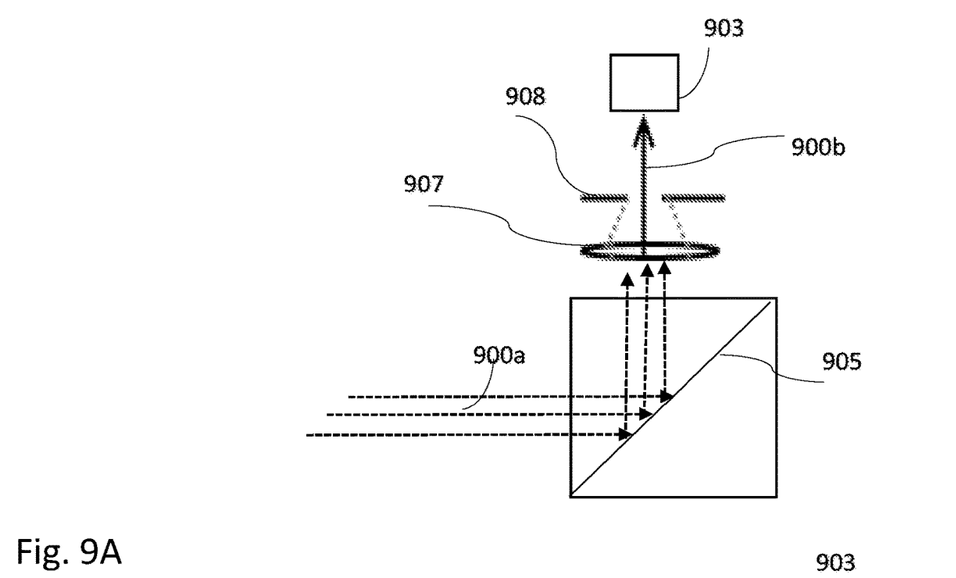
FIGS. 9A and 9B illustrate alternative exemplary implementations for reducing the effect of extraneous illumination on the sensitivity of the detection system, ensuring that only light coming from the returning beam is focused towards the detector, so that the detector can more accurately determine the state of the external window.
Figure 9B:
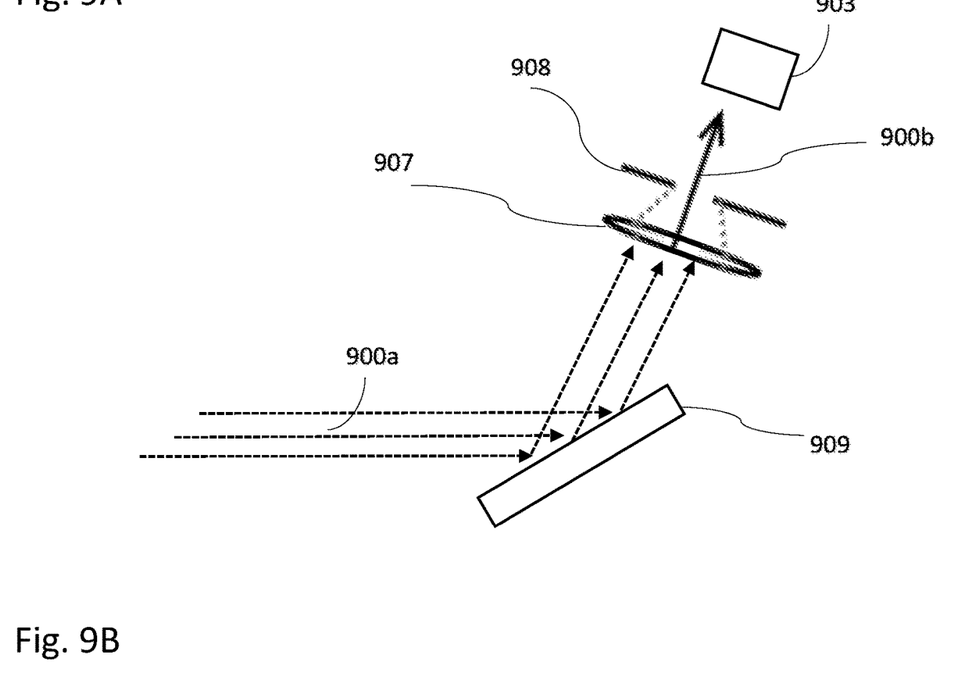

Reference is now made to FIGS. 9A and 9B, which illustrate exemplary implementations of reducing the effect of extraneous illumination on the sensitivity of the detection system. Beam 900a, travelling back from the window, is reflected by polarizing beam splitter 905 towards lens 907. Lens 907 focuses the beam 900b through aperture 908 towards the detector 903, such that the aperture 908 only allows light focused by the lens 901 through, and blocks any light coming from any other direction.

This system thus ensures that only light coming from the returning beam is focused towards the detector 903, thus ensuring that the detector accurately receives and measures the amount of beam being reflected off the window area 802a, and does not receive illumination from sources other than the returning beam 900a, so that the detector can more accurately determine the state of the external window.

Reference is now made to FIG. 9B, which shows a Brewster Plate 909 in place of the polarizing beam splitter shown in FIG. 9A, for diverting the polarized beam returning from the window.

Figure 10:
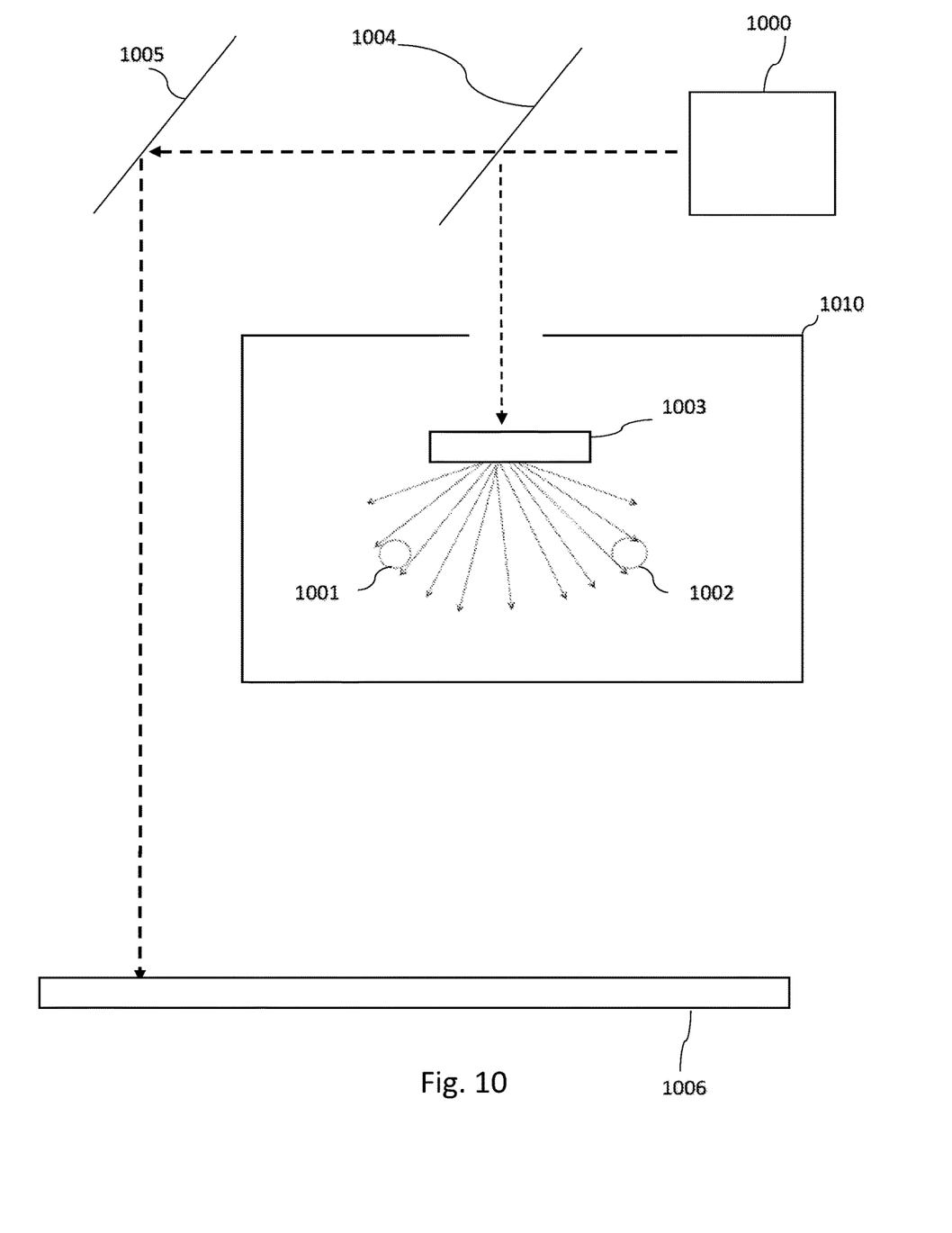
FIG. 10 illustrates a further exemplary implementation of a power monitor for determining the power of the beam emitted by the laser, and thus whether the beam is at a safe level, both within the external enclosure, and outside the external enclosure.

Reference is now made to FIG. 10, illustrating an exemplary implementation of a power monitor 1010, used for determining the power of the beam emitted by the laser, and thus whether the beam is at a safe level, both within the external enclosure, and outside the external enclosure.

Although most of the beam being emitted by the laser 1000 travels through the beam splitter 1004 towards the scanning mirror 1005, and out of laser's external enclosure's window 1006 towards receivers (not shown), in order to measure the level of the beam being emitted by the laser, a small portion of the beam is coupled out through the beam splitter 1004 towards the power monitor 1010. Thus, the portion of beam reaching the power monitor is representative of the whole beam emitted by the laser.

A diffuser 1003 is used within the power monitor 1010 to average out any spatial structure of the portion of the beam reaching the detectors, such that the beam reaches detectors 1001 and 1002 as more uniform illumination. Two detectors are advantageously shown in FIG. 10 for redundancy, such that the measurements coming from the detectors are compared so that any inconsistency may show one or both of the detectors having a fault.

Furthermore, an exemplary system for determining whether the level of beam emitted by the laser may include a processor (not shown), which may be inside or outside of the transmitter, receiving input from the detectors in the power monitor, and determining whether the level of illumination that the detectors receive is representative of a safe level of beam which is emitted by the laser.

The system as shown by 1010 in FIG. 10, namely using a diffuser to average out any spatial structure of the portion of the beam reaching the detector, or using more than one detector for redundancy, may similarly be implemented in the broken window detector, in order to ensure that the broken window detector gives an accurate representation of the beam being reflected off the external enclosure's window.

It is appreciated by persons skilled in the art that the present invention is not limited by what has been particularly shown and described hereinabove. Rather the scope of the present invention includes both combinations and subcombinations of various features described hereinabove as well as variations and modifications thereto which would occur to a person of skill in the art upon reading the above description and which are not in the prior art.

We claim:

1. A wireless power transmission system comprising:
(i) a laser adapted to emit a beam;
(ii) a power monitor configured to provide an indication of the optical power of said beam;
(iii) an external enclosure comprising an optical window configured to transmit said beam out of said external enclosure;
(iv) an internal enclosure within said external enclosure, comprising:
said laser;
said power monitor; and
internal walls, at least a major part of which have beam blocking properties, being at least one of (a) opaque, (b) partially transmissive having an optical density of at least 0.5, or (c) diffusive, said beam blocking part of said walls being configured to essentially absorb or diffuse at least part of said beam, or a reflection of said beam caused by an object inserted into the beam, if said part of said beam or said reflection of said beam is directed onto said beam blocking part of said walls, such that no part of said beam or said reflection of said beam can be directed out of said enclosures other than through said optical window;
(v) a beam deflection unit; and
(vi) a control unit configured to control said laser,
wherein said system further comprises a detection unit configured to provide information enabling an indication of damage to said optical window of said external enclosure, said control unit configured to respond to said indication by causing a modification of a configuration of said system.

2. The wireless power transmission system of claim 1, wherein said modification of said configuration of said system comprises a modification in said laser beam.

3. The wireless power transmission system according to claim 1, further comprising a collimator configured to cause said beam to diverge within the working range of said transmitter to no more than 5 degrees, said collimator positioned inside said internal enclosure.

4. The wireless power transmission system according to claim 1, wherein said external enclosure's window has a transmittance of at least 90%.

5. The wireless power transmission system according to claim 1 wherein said internal enclosure's window has a transmittance of at least 90%.

6. The wireless power transmission system according to claim 1 wherein said beam deflector is inside said internal enclosure.

7. The wireless power transmission system according to claim 1, further comprising at least one additional power monitor.

8. The wireless power transmission system according to claim 1, wherein said laser comprises a first beam power mode and a second beam power mode, the first beam power mode having a power less than the second beam power mode.

9. The wireless power transmission system according to claim 1 further comprising at least one optical element adapted to change the polarization of the emitted beam.

10. The wireless power transmission system according to claim 9 wherein said optical element is aligned at a small angle from being normal to said beam.

11. The wireless power transmission system according to claim 1 wherein said laser emits a linearly polarized beam.

12. The wireless power transmission system according to claim 1 wherein said beam traversing said window is an elliptically polarized beam or a circularly polarized beam.

13. A wireless power transmission system comprising:
(i) a laser adapted to emit a beam;
(ii) an enclosure for housing said laser, comprising:
  (a) a beam blocking portion;
  (b) an optical window for transmitting said beam; and
  (c) a scanning mirror adapted for directing said beam;
(iii) a detection unit configured to provide an indication of the integrity of said optical window; and
(iv) a control unit adapted to receive signals from said detection unit and if said signals indicate that the integrity of the optical window has been compromised, said control unit is adapted to change at least one of (i) an output of said laser and (ii) a configuration of said system,
characterized in that said scanning mirror is adapted to direct said beam to a pre-defined portion of said optical window at predetermined intervals, such that the control unit can determine the integrity of said optical window.

14. A wireless power transmission system according to claim 13 wherein said detection unit is disposed inside said enclosure, and is configured to detect that portion of the beam reflected from a pre-defined portion of said optical window, wherein should said integrity be compromised, either said portion of said beam would not reach said detector, or said portion of said beam reaching the detector would be degraded.

15. A wireless power transmission system according to either of claim 13 wherein said optical window has a conductive coating, such that should the integrity of said optical window be compromised, the conductance of said conductive coating would be degraded.

16. A wireless power transmission system according to claim 13 wherein said detection unit comprises an optical sensor disposed at an edge of said optical window, and which detects light transmitted within the thickness and along a length of said window, from a source disposed at an opposite edge of said window.

17. The wireless power system according to claim 13 wherein said window is spherical, concave to the inside of the transmitter, and a pivot of the scanning mirror and said detection unit are positioned at conjugate object and image positions, such that a beam reflected by the spherical window always arrives at said detection unit, for a range of angles of the scanning mirror.

18. The wireless power system according to claim 13 further comprising at least one power monitor, adapted to detect the power level of said emitted laser beam.

19. The wireless power system according to claim 13 wherein said beam blocking portion is at least one of (a) opaque, (b) partially transmissive and having an optical density of at least 0.5, or (c) diffusive, said beam blocking portion being configured to essentially absorb or diffuse either at least part of said beam or a reflection of said beam caused by an object inserted into the beam, if said part of said beam or said reflection of said beam is directed onto said beam blocking potion, such that no part of said beam or said reflection of said beam can be directed out of said enclosure other than through said optical window.

20. The wireless power transmission system according to claim 13, wherein said optical window has a transmittance of at least 90% to light of the wavelength of said laser beam.

* * * * *